United States Patent
Huang (10) Patent No.: US 11,887,992 B2
(45) Date of Patent: Jan. 30, 2024

(54) SUBSTRATE AND DISPLAY DEVICE (71) Applicant: TCL China Star Optoelectronics Technology Co., Ltd., Shenzhen (CN)

(72) Inventor: Yuanke Huang, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 86 days.

(21) Appl. No.: 16/618,403

(22) PCT Filed: Sep. 11, 2019

(86) PCT No.: PCT/CN2019/105323
§ 371 (c)(1),
(2) Date: Dec. 2, 2019

(87) PCT Pub. No.: WO2020/244086
PCT Pub. Date: Dec. 10, 2020

(65) Prior Publication Data
US 2022/0352212 A1 Nov. 3, 2022

(30) Foreign Application Priority Data
Jun. 6, 2019 (CN) .......................... 201910491381.0

(51) Int. Cl.
*H01L 27/12* (2006.01)
(52) U.S. Cl.
CPC ................. *H01L 27/1222* (2013.01)
(58) Field of Classification Search
CPC ............ H01L 27/1248; H01L 27/1244; G02F 1/136222
See application file for complete search history.

(56) References Cited

U.S. PATENT DOCUMENTS

| | | | |
|---|---|---|---|
| 2006/0033853 | A1 | 2/2006 | Lee et al. |
| 2006/0152663 | A1* | 7/2006 | Kamoshida ........... G02F 1/1345 349/149 |
| 2007/0281474 | A1 | 12/2007 | Suzuki et al. |
| 2009/0093117 | A1 | 4/2009 | Taguchi et al. |
| 2009/0243120 | A1 | 10/2009 | Kita et al. |
| 2014/0231762 | A1* | 8/2014 | Choi ................. H01L 21/76805 257/40 |

FOREIGN PATENT DOCUMENTS

| | | |
|---|---|---|
| CN | 1740883 A | 3/2006 |
| CN | 101075554 A | 11/2007 |
| CN | 101546734 A | 9/2009 |
| CN | 102646684 A | 8/2012 |

(Continued)

*Primary Examiner* — Peter M Albrecht
(74) *Attorney, Agent, or Firm* — PV IP PC; Wei Te Chung; Zhigang Ma (57) ABSTRACT

A substrate and a display device are provided. A first film layer of the substrate is formed on a third film layer and patterned to form a target pattern. A second film layer is formed on the third film layer and the first film layer. Within a distribution area of the target pattern, film edges of the first film layer are formed with protrusion structures facing the second film layer. Based on the protrusion structures, a deformable margin of the first film layer and the second film layer at a stacking position is increased, and a pattern of the second film layer is thus prevented from being cracked to generate cracks.

20 Claims, 6 Drawing Sheets

(56) References Cited

FOREIGN PATENT DOCUMENTS

| | | |
|---|---|---|
| CN | 105355630 A | 2/2016 |
| CN | 106952927 A | 7/2017 |
| CN | 107170749 A | 9/2017 |
| CN | 109817675 A | 5/2019 |
| JP | 2016048760 A | 4/2016 |

* cited by examiner

SUBSTRATE AND DISPLAY DEVICE

FIELD OF INVENTION

The present application relates to the field of display devices. In particular, the present application relates to a substrate and a display device.

BACKGROUND OF INVENTION

A display device consists of a substrate, and the substrate is formed with stacked film layers.

Figure 1:
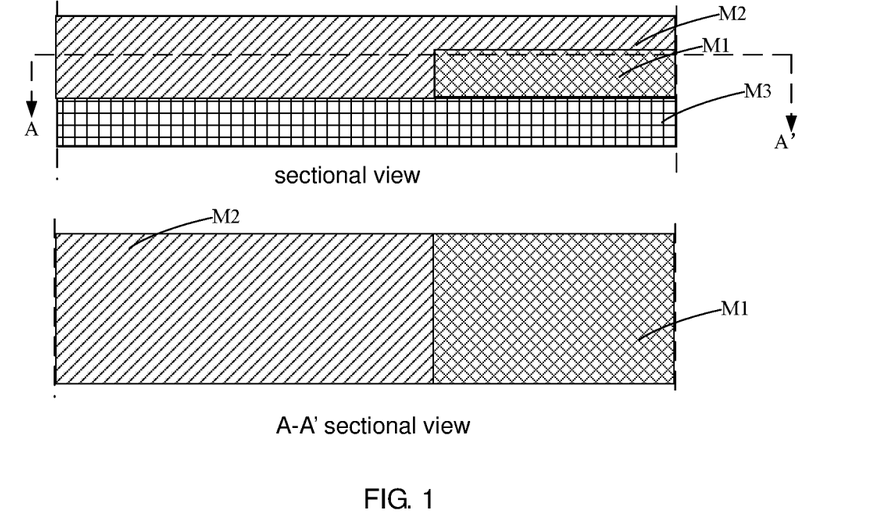
FIG. 1 is a schematic view of configuration of film layers of a current substrate.

As shown in FIG. 1, the current substrate includes a first film layer M1 and a second film layer M2 stacked on each other. The first film layer M1 and the second film layer M2 are formed on a third film layer M3. A film edge of the first film layer M1 contacted with the second film layer M2 is a plane. Because film shrinkage rates of different material are inconsistent, the first film layer M1 may generate a stress to crack the second film layer M2 at an overlapping position between the different film layers. In particular, when the first film layer M1 is made of organic material and the second film layer M2 is made of inorganic material (such as copper), a tensile cracking effect is greater, thereby resulting in defective phenomena such as a broken wiring of a pattern of the second film layer M2.

Therefore, it is required to improve a configuration manner of the film layers of the current substrate that easily causes the film layers to be cracked.

SUMMARY OF INVENTION

The present application provides a substrate and a display device to ameliorate a technical problem that film layers of a current substrate are configured in a manner that easily causes the film layers to be cracked.

In order to solve the above problem, technical solutions provided by the present application are as follows:

Embodiments of the present application provide a substrate, including:
a first film layer;
a second film layer;
a third film layer;
wherein the first film layer is formed on the third film layer, and patterned to form a target pattern;
wherein the second film layer is formed on the third film layer and the first film layer, and the second film layer is stacked on the first film layer on edges of a distribution area of the target pattern; and
wherein a film shrinkage rate of the second film layer is less than a film shrinkage rate of the first film layer, and film edges of the first film layer are formed with protrusion structures facing the second film layer within the distribution area of the target pattern.

In the substrate provided in the embodiments of the present application, the film edges of the first film layer stacked by the second film layer are formed with the protrusion structures.

In the substrate provided in the embodiments of the present application, the first film layer is formed with at least three of the protrusion structures within the distribution area of the target pattern.

In the substrate provided in the embodiments of the present application, a distance between two of the protrusion structures adjacent to each other is at least three times greater than a width of the protrusion structure.

In the substrate provided in the embodiments of the present application, a horizontal cross-section of the protrusion structure is at least one of a rectangle, a trapezoid, and an arc.

In the substrate provided in the embodiments of the present application, material of the first film layer is organic material, and material of the second film layer is inorganic material.

In the substrate provided in the embodiments of the present application, the substrate is a color filter substrate, the first film layer is a color filter layer and/or an organic planarization layer, and the second film layer is a transparent common electrode layer.

In the substrate provided in the embodiments of the present application, the substrate is an array substrate, the first film layer is a color filter layer, and the second film layer is a metal layer.

In the substrate provided in the embodiments of the present application, the first film layer is patterned to form through-holes and recesses.

In the substrate provided in the embodiments of the present application, the substrate is an array substrate, the first film layer is an organic polymer material layer, and the second film layer is a transparent common electrode layer.

Embodiments of the present application provide a display device, the display device includes a display panel, and a substrate of the display panel includes:
a first film layer;
a second film layer;
a third film layer;
wherein the first film layer is formed on the third film layer, and patterned to form a target pattern;
wherein the second film layer is formed on the third film layer and the first film layer, and the second film layer is stacked on the first film layer on edges of a distribution area of the target pattern; and
wherein a film shrinkage rate of the second film layer is less than a film shrinkage rate of the first film layer, and film edges of the first film layer are formed with protrusion structures facing the second film layer within the distribution area of the target pattern.

In the display device provided in the embodiments of the present application, the film edges of the first film layer stacked by the second film layer are formed with the protrusion structures.

In the display device provided in the embodiments of the present application, the first film layer is formed with at least three of the protrusion structures within the distribution area of the target pattern.

In the display device provided in the embodiments of the present application, a distance between two of the protrusion structures adjacent to each other is at least three times greater than a width of the protrusion structure.

In the display device provided in the embodiments of the present application, a horizontal cross-section of the protrusion structure is at least one of a rectangle, a trapezoid, and an arc.

In the display device provided in the embodiments of the present application, material of the first film layer is organic material, and material of the second film layer is inorganic material.

In the display device provided in the embodiments of the present application, the substrate is a color filter substrate, the first film layer is a color filter layer and/or an organic planarization layer, and the second film layer is a transparent common electrode layer.

In the display device provided in the embodiments of the present application, the substrate is an array substrate, the first film layer is a color filter layer, and the second film layer is a metal layer.

In the display device provided in the embodiments of the present application, the first film layer is patterned to form through-holes and recesses.

In the display device provided in the embodiments of the present application, the substrate is an array substrate, the first film layer is an organic polymer material layer, and the second film layer is a transparent common electrode layer.

Advantageous effects of the present application:

The present application provides a substrate and a display device. The substrate includes a first film layer, a second film layer and a third film layer. The first film layer is formed on the third film layer and patterned to form the target pattern, and the second film layer is formed on the third film layer and the first film layer. The second film layer is stacked on the first film layer on the edges of the distribution area of the target pattern. The film shrinkage rate of the second film layer is less than the film shrinkage rate of the first film layer. The film edges of the first film layer are formed with the protrusion structures facing the second film layer within the distribution area of the target pattern. Based on the protrusion structures, the substrate provided by the present application increases a deformable margin of the first film layer and the second film layer at the stacking position, so that a tensile force between both of the film layers is ameliorated, and a pattern of the second film layer is thus prevented from being cracked to generate cracks. Besides, the protrusion structures also prevent the cracks from extending to ameliorate the technical problem that the film layers of the current substrate are configured in a manner that easily causes the film layers to be cracked, thereby providing a stability of product performance.

DESCRIPTION OF DRAWINGS

In order to more clearly illustrate technical solutions in embodiments and the prior art, the drawings required for using in the description of the embodiments and the prior art will be briefly described below. Obviously, the drawings in the following description are only some of the embodiments of the application. For ordinary technicians in the art, other drawings may also be obtained from these drawings without paying for creative labor.

DETAILED DESCRIPTION OF PREFERRED EMBODIMENTS

Referring to the accompanying drawings, the description of following embodiments is provided to illustrate the specific embodiment practiced by the present application. Directional terms described by the present application, such as upper, lower, front, back, left, right, inner, outer, side, etc., are only directions by referring to the accompanying drawings. Therefore, the used directional terms are applied to describe and understand the present application, but the present application is not limited thereto. In the drawings, units with the similar structure are represented by the same reference symbols.

The embodiments of the present application can ameliorate a technical problem that film layers of a current substrate are configured in a manner that easily causes the film layers to be cracked.

Figure 2:
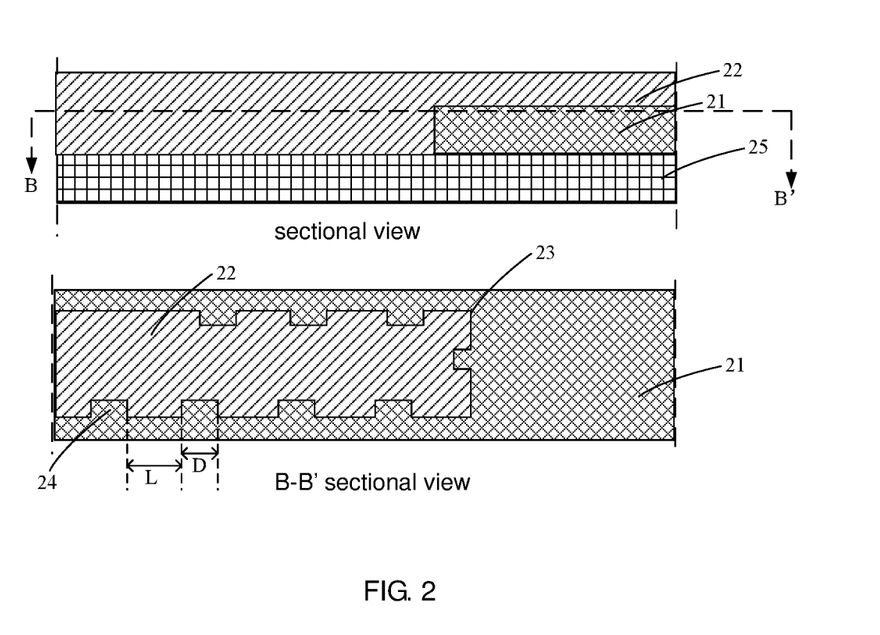
FIG. 2 is a schematic view of a first structure of a substrate provided by the embodiments of the present application.

As shown in FIG. 2, a substrate 2 provided by the present application includes:
a first film layer 21;
a second film layer 22;
a third film layer 25;
wherein the first film layer 21 is formed on the third film layer 25, and patterned to form a target pattern 23;
wherein the second film layer 22 is formed on the third film layer 25 and the first film layer 21, and the second film layer 22 is stacked on the first film layer 21 on edges of a distribution area of the target pattern 23; and
wherein a film shrinkage rate of the second film layer 22 is less than a film shrinkage rate of the first film layer 21, and film edges of the first film layer 21 are formed with protrusion structures 24 facing the second film layer 22 within the distribution area of the target pattern 23.

The film shrinkage rate means a rate of change of the film layer per volume under a specific condition. A film shrinkage of a general organic material film layer is much greater than a film shrinkage of an inorganic material film layer.

This embodiment provides a substrate. The substrate includes the first film layer, the second film layer and the third film layer. The first film layer is formed on the third film layer and patterned to form a target pattern, and the second film layer is formed on the third film layer and the first film layer. The second film layer is stacked on the first film layer on the edges of a distribution area of the target pattern. The film shrinkage rate of the second film layer is less than the film shrinkage rate of the first film layer. The film edges of the first film layer are formed with the protrusion structures facing the second film layer within the distribution area of the target pattern. Based on the protrusion structures, the substrate provided by the present application increases a deformable margin of the first film layer and the second film layer at a stacking position, so that a tensile force between both of the film layers is ameliorated, and a pattern of the second film layer is thus prevented from being cracked to generate cracks. Besides, the protrusion structures also prevent the cracks from extending to ameliorate the technical problem that the film layers of the current substrate are configured in a manner that easily causes the film layers to be cracked, thereby providing the stability of product performance.

Figure 3:
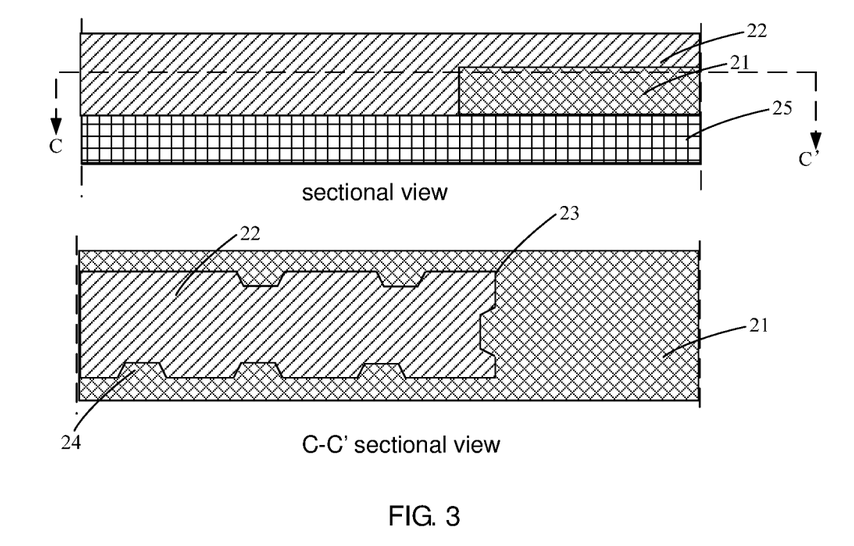
FIG. 3 is a schematic view of a second structure of the substrate provided by the embodiments of the present application.

In one embodiment, as shown in FIG. 3, the film edges of the first film layer 21 stacked by the second film layer 22 are formed with the protrusion structures 24. When the first film layer 21 is manufactured, it is only required for a conventional photolithography process, and it is not necessary to use a mask corresponding to the second film layer 22.

In one embodiment, as shown in FIG. 2, the first film layer 21 is formed with at least three of the protrusion structures 24 within the distribution area of the target pattern 23. The embodiment makes the effect better by distributing at least three of the protrusion structures.

In one embodiment, as shown in FIG. 2, a distance L between two of the protrusion structures adjacent to each other is at least three times greater than a width D of the protrusion structure, that is, L is greater than D, to enhance the effect.

Figure 4:
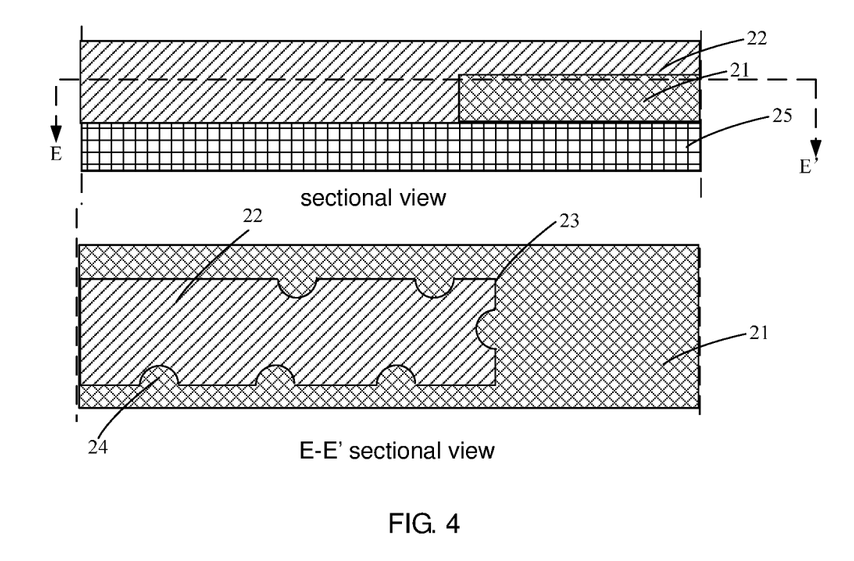
FIG. 4 is a schematic view of a third structure of the substrate provided by the embodiments of the present application.

In one embodiment, as shown in FIGS. 2 to 4, a horizontal cross-section of the protrusion structure 24 is at least one of a rectangle, a trapezoid, and an arc.

In one embodiment, material of the first film layer is organic material, and material of the second film layer is inorganic material.

In one embodiment, the substrate 2 is a color filter substrate, the first film layer 21 is a color filter layer, and the second film layer 22 is a transparent common electrode layer.

In one embodiment, the substrate 2 is a color filter substrate, the first film layer 21 is an organic planarization layer, and the second film layer 22 is a transparent common electrode layer.

In one embodiment, the substrate 2 is an array substrate, the first film layer 21 is a color filter layer, and the second film layer 22 is a metal layer. In the embodiment, the array substrate is an array substrate on which the color filter layer is disposed.

In one embodiment, the first film layer 21 is patterned to form through-holes and recesses.

In one embodiment, the substrate 2 is an array substrate, the first film layer 21 is an organic polymer material layer, such as a polyfluoroalkoxy (PFA) material layer, and the second film layer 22 is a transparent common electrode layer.

In one embodiment, material of the transparent common electrode layer may be indium tin oxide, indium zinc oxide, aluminum zinc oxide, and so on.

In one embodiment, material of the metal layer may be copper-molybdenum laminate, copper-molybdenum-titanium laminate, copper-titanium laminate, aluminum-molybdenum laminate, copper beryllium alloy, nickel-chromium alloy, and so on.

In order to obtain the substrate 2 shown in FIG. 2, the present application also provides a manufacturing method of the substrate, the method includes following steps.

Figure 5:
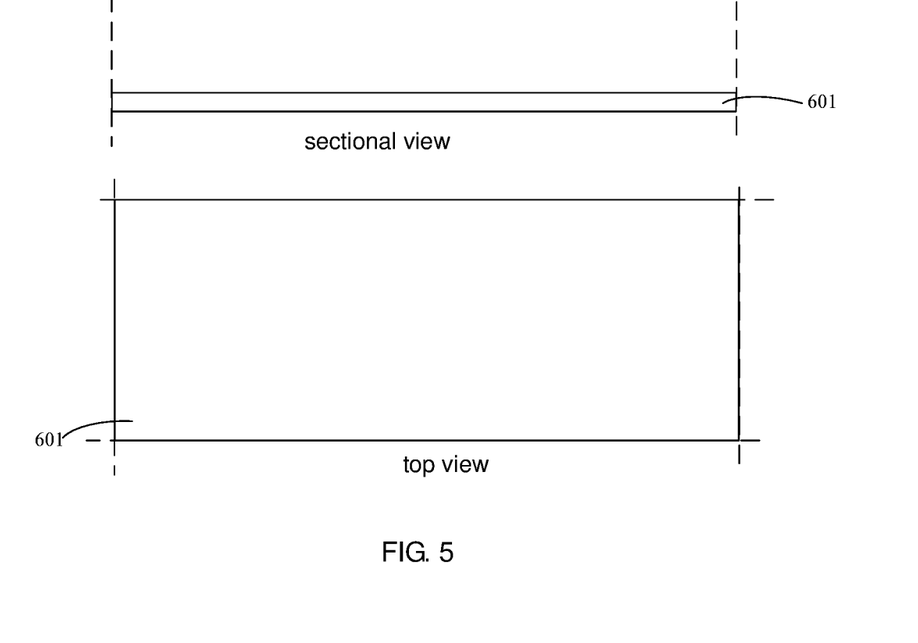
FIGS. 5 to 8 are schematic views of a manufacturing process of the substrate provided by the embodiments of the present application.

As shown in FIG. 5, a base substrate 601 is provided.

The base substrate 601 may be a glass substrate, a rigid substrate, etc., and is subjected to treatments such as cleaning.

Figure 6:
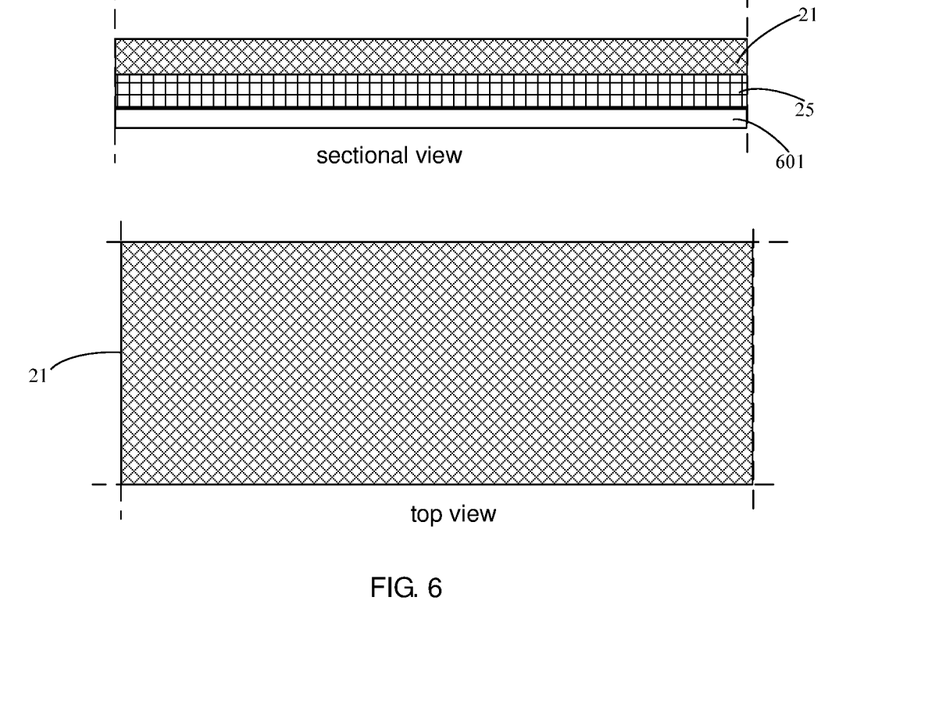

As shown in FIG. 6, the third film layer 25 and the first film layer 21 are formed on the base substrate 601.

The third film layer 25 may be a flexible substrate, a buffer layer, a planarization layer, an insulating layer, an active layer, and so on.

The material of the first film layer 21 is the organic material, and the first film layer 21 may be the color filter layer or the organic planarization layer of the color filter substrate, and the color filter layer or the organic polymer material layer of the array substrate.

Figure 7:
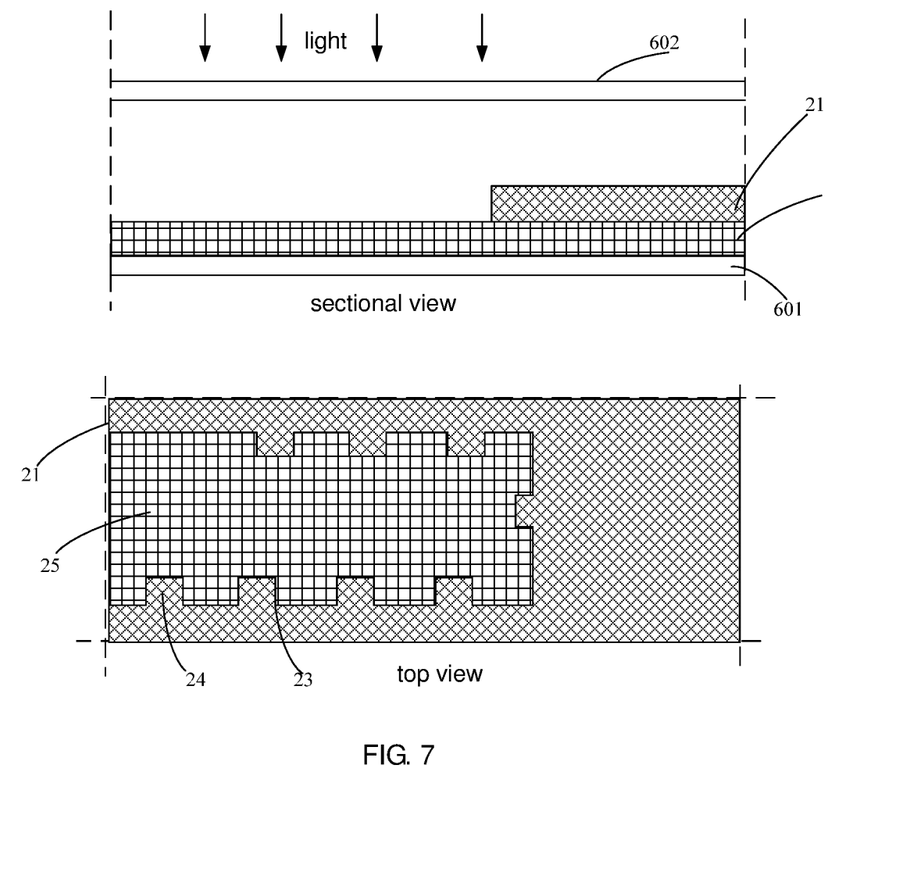

As shown in FIG. 7, the first film layer 21 is subjected to a photolithography process.

By using a mask 602 corresponding to the target pattern and the protrusion structures, the first film layer 21 is subjected to the photolithography process by light, such as ultraviolet light, to form the target pattern such as the through-holes and the recesses, and the protrusion structures are thus formed within the distribution area of the target pattern.

In one embodiment, the step is that the film edges of the first film layer 21 stacked by the second film layer 22 are formed with the protrusion structures 24.

In one embodiment, the first film layer 21 is formed with at least three of the protrusion structures 24 within the distribution area of the target pattern.

In one embodiment, the distance between two of the protrusion structures adjacent to each other is at least three times greater than the width of the protrusion structure.

In one embodiment, the horizontal cross-section of the protrusion structure 24 is at least one of the rectangle, the trapezoid, and the arc.

Figure 8:
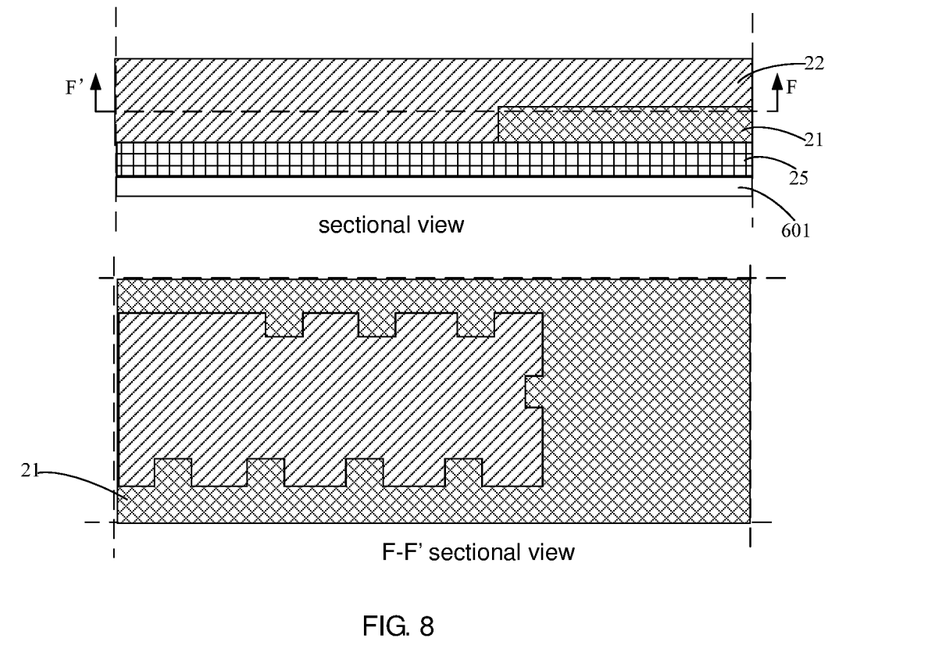

As shown in FIG. 8, the second film layer 22 is formed on the first film layer 21 and the third film layer 25.

The material of the second film layer 22 is the inorganic material, and the second film layer 22 may be the transparent common electrode layer of the color filter substrate, and the metal layer or the transparent common electrode layer of the array substrate.

Afterward, the second film layer 22 is patterned to form the respective pattern.

By using a mask corresponding to the second film layer 22, the second film layer 22 is patterned to form at least one of the corresponding patterns such as a pixel electrode, a source, a drain, a gate and a signal wire.

Finally, the base substrate 601 is removed to obtain the substrate 2 shown in FIG. 2.

Moreover, the present application provides a display panel, and the substrate of the display panel includes:
a first film layer;
a second film layer;
a third film layer;
wherein the first film layer is formed on the third film layer, and patterned to form a target pattern;
wherein the second film layer is formed on the third film layer and the first film layer, and the second film layer is stacked on the first film layer on edges of a distribution area of the target pattern; and
wherein a film shrinkage rate of the second film layer is less than a film shrinkage rate of the first film layer, and film edges of the first film layer are formed with protrusion structures facing the second film layer within the distribution area of the target pattern.

In one embodiment, in the display panel provided by the embodiments of the application, the film edges of the first film layer stacked by the second film layer are formed with the protrusion structures.

In one embodiment, in the display panel provided by the embodiments of the application, the first film layer is formed with at least three of the protrusion structures within the distribution area of the target pattern.

In one embodiment, in the display panel provided by the embodiments of the application, a distance between two of the protrusion structures adjacent to each other is at least three times greater than a width of the protrusion structure.

In one embodiment, in the display panel provided by the embodiments of the application, a horizontal cross-section of the protrusion structure is at least one of a rectangle, a trapezoid, and an arc.

In one embodiment, in the display panel provided by the embodiments of the application, material of the first film layer is organic material, and material of the second film layer is inorganic material.

In one embodiment, in the display panel provided by the embodiments of the application, the substrate is a color filter substrate, the first film layer is a color filter layer and/or an organic planarization layer, and the second film layer is a transparent common electrode layer.

In one embodiment, in the display panel provided by the embodiments of the application, the substrate is an array substrate, the first film layer is a color filter layer, and the second film layer is a metal layer.

In one embodiment, in the display panel provided by the embodiments of the application, the first film layer is patterned to form through-holes and recesses.

In one embodiment, in the display panel provided by the embodiments of the application, the substrate is an array substrate, the first film layer is an organic polymer material layer, and the second film layer is a transparent common electrode layer.

Furthermore, the present application provides a display device, the display device display includes the display panel, and the substrate of the display panel includes:
- a first film layer;
- a second film layer;
- a third film layer;
- wherein the first film layer is formed on the third film layer, and patterned to form a target pattern;
- wherein the second film layer is formed on the third film layer and the first film layer, and the second film layer is stacked on the first film layer on edges of a distribution area of the target pattern; and
- wherein a film shrinkage rate of the second film layer is less than a film shrinkage rate of the first film layer, and film edges of the first film layer are formed with protrusion structures facing the second film layer within the distribution area of the target pattern.

In one embodiment, in the display device provided by the embodiments of the application, the film edges of the first film layer stacked by the second film layer are formed with the protrusion structures.

In one embodiment, in the display device provided by the embodiments of the application, the first film layer is formed with at least three of the protrusion structures within the distribution area of the target pattern.

In one embodiment, in the display device provided by the embodiments of the application, a distance between two of the protrusion structures adjacent to each other is at least three times greater than a width of the protrusion structure.

In one embodiment, in the display device provided by the embodiments of the application, a horizontal cross-section of the protrusion structure is at least one of a rectangle, a trapezoid, and an arc.

In one embodiment, in the display device provided by the embodiments of the application, material of the first film layer is organic material, and material of the second film layer is inorganic material.

In one embodiment, in the display device provided by the embodiments of the application, the substrate is a color filter substrate, the first film layer is a color filter layer and/or an organic planarization layer, and the second film layer is a transparent common electrode layer.

In one embodiment, in the display device provided by the embodiments of the application, the substrate is an array substrate, the first film layer is a color filter layer, and the second film layer is a metal layer.

In one embodiment, in the display device provided by the embodiments of the application, the first film layer is patterned to form through-holes and recesses.

In one embodiment, in the display device provided by the embodiments of the application, the substrate is an array substrate, the first film layer is an organic polymer material layer, and the second film layer is a transparent common electrode layer.

According to the above embodiments, it can be known that the present application provides a substrate and a display device. The substrate includes the first film layer, the second film layer and the third film layer. The first film layer is formed on the third film layer and patterned to form the target pattern, and the second film layer is formed on the third film layer and the first film layer. The second film layer is stacked on the first film layer on the edges of the distribution area of the target pattern. The film shrinkage rate of the second film layer is less than the film shrinkage rate of the first film layer. The film edges of the first film layer are formed with the protrusion structures facing the second film layer within the distribution area of the target pattern. Based on the protrusion structures, the substrate provided by the present application increases the deformable margin of the first film layer and the second film layer at the stacking position, so that the tensile force between both of the film layers is ameliorated, and the pattern of the second film layer is thus prevented from being cracked to generate the cracks. Besides, the protrusion structures also prevent the cracks from extending to ameliorate the technical problem that the film layers of the current substrate are configured in a manner that easily causes the film layers to be cracked, thereby providing the stability of product performance.

In summary, although the present application has been disclosed with preferred embodiments, they don't intend to limit the present application, and the ordinary technicians in the art can make various changes and modifications without departing from the spirit and the scope of the present application. Therefore, the protection of the present application is defined by the scope of the claims.

What is claimed is:

1. A substrate, comprising:
   - a first film layer;
   - a second film layer;
   - a third film layer;
   - wherein the first film layer is formed on the third film layer, and patterned to form a target pattern;
   - wherein the second film layer is formed on the third film layer and the first film layer, and the second film layer is stacked on the first film layer on edges of a distribution area of the target pattern;
   - wherein a film shrinkage rate of the second film layer is less than a film shrinkage rate of the first film layer, and film edges of the first film layer are formed with protrusion structures facing the second film layer within the distribution area of the target pattern;
   - wherein the first film layer is formed with at least three of the protrusion structures within the distribution area of the target pattern; and
   - wherein a distance between two of the protrusion structures adjacent to each other is at least three times greater than a width of the protrusion structure.

2. The substrate according to claim 1, wherein the film edges of the first film layer stacked by the second film layer are formed with the protrusion structures.

3. The substrate according to claim 1, wherein a horizontal cross-section of the protrusion structure is at least one of a rectangle, a trapezoid, and an arc.

4. The substrate according to claim 1, wherein material of the first film layer is organic material, and material of the second film layer is inorganic material.

5. The substrate according to claim 4, wherein the substrate is a color filter substrate, the first film layer is a color filter layer and/or an organic planarization layer, and the second film layer is a transparent common electrode layer.

6. The substrate according to claim 4, wherein the substrate is an array substrate, the first film layer is a color filter layer, and the second film layer is a metal layer.

7. The substrate according to claim 6, wherein the first film layer is patterned to form through-holes and recesses.

8. The substrate according to claim 4, wherein the substrate is an array substrate, the first film layer is an organic polymer material layer, and the second film layer is a transparent common electrode layer.

9. A display device, including:
a display panel, a substrate of the display panel including:
a first film layer;
a second film layer;
a third film layer;
wherein the first film layer is formed on the third film layer, and patterned to form a target pattern;
wherein the second film layer is formed on the third film layer and the first film layer, and the second film layer is stacked on the first film layer on edges of a distribution area of the target pattern; and
wherein a film shrinkage rate of the second film layer is less than a film shrinkage rate of the first film layer, and film edges of the first film layer are formed with protrusion structures facing the second film layer within the distribution area of the target pattern;
wherein the first film layer is formed with at least three of the protrusion structures within the distribution area of the target pattern; and
wherein a distance between two of the protrusion structures adjacent to each other is at least three times greater than a width of the protrusion structure.

10. The display device according to claim 9, wherein the film edges of the first film layer stacked by the second film layer are formed with the protrusion structures.

11. The display device according to claim 9, wherein a horizontal cross-section of the protrusion structure is at least one of a rectangle, a trapezoid, and an arc.

12. The display device according to claim 9, wherein material of the first film layer is organic material, and material of the second film layer is inorganic material.

13. The display device according to claim 12, wherein the substrate is a color filter substrate, the first film layer is a color filter layer and/or an organic planarization layer, and the second film layer is a transparent common electrode layer.

14. The display device according to claim 12, wherein the substrate is an array substrate, the first film layer is a color filter layer, and the second film layer is a metal layer.

15. The display device according to claim 14, wherein the first film layer is patterned to form through-holes and recesses.

16. The display device according to claim 12, wherein the substrate is an array substrate, the first film layer is an organic polymer material layer, and the second film layer is a transparent common electrode layer.

17. A substrate, comprising:
a first film layer;
a second film layer;
a third film layer;
wherein the first film layer is formed on the third film layer, and patterned to form a target pattern;
wherein the second film layer is formed on the third film layer and the first film layer, and the second film layer is stacked on the first film layer on edges of a distribution area of the target pattern;
wherein a film shrinkage rate of the second film layer is less than a film shrinkage rate of the first film layer, and film edges of the first film layer are formed with protrusion structures facing the second film layer within the distribution area of the target pattern;
wherein material of the first film layer is organic material, and material of the second film layer is inorganic material; and
wherein the substrate is a color filter substrate, the first film layer is a color filter layer and/or an organic planarization layer, and the second film layer is a transparent common electrode layer.

18. The substrate according to claim 17, wherein the film edges of the first film layer stacked by the second film layer are formed with the protrusion structures.

19. The substrate according to claim 17, wherein the first film layer is formed with at least three of the protrusion structures within the distribution area of the target pattern.

20. The substrate according to claim 17, wherein a horizontal cross-section of the protrusion structure is at least one of a rectangle, a trapezoid, and an arc.

* * * * *